United States Patent [19]
Neilson

[11] 4,062,032
[45] Dec. 6, 1977

[54] GATE TURN OFF SEMICONDUCTOR RECTIFIERS

[75] Inventor: John Manning Savidge Neilson, Mountaintop, Pa.

[73] Assignee: RCA Corporation, New York, N.Y.

[21] Appl. No.: 580,771

[22] Filed: May 27, 1975

Related U.S. Application Data

[63] Continuation-in-part of Ser. No. 364,664, May 29, 1973, abandoned.

[51] Int. Cl.² .......................................... H01L 29/90
[52] U.S. Cl. ..................................... 357/13; 357/38; 357/58; 357/90
[58] Field of Search ...................... 357/13, 37, 38, 58, 357/90

[56] References Cited
U.S. PATENT DOCUMENTS

| | | | |
|---|---|---|---|
| 3,146,135 | 8/1964 | Sah | 357/38 |
| 3,337,783 | 8/1967 | Stehney | 357/38 |
| 3,370,209 | 2/1968 | Davis et al. | 357/38 |
| 3,538,401 | 11/1970 | Chu | 357/38 |
| 3,566,206 | 2/1971 | Bartecink et al. | 357/58 |
| 3,798,079 | 3/1974 | Chu et al. | 357/90 |

Primary Examiner—Stanley D. Miller, Jr.
Assistant Examiner—Joseph E. Clawson, Jr.
Attorney, Agent, or Firm—H. Christoffersen; R. P. Williams; R. A. Hays

[57] ABSTRACT

In semiconductor controlled rectifiers which can be of otherwise conventional design and configuration, a layer of relatively high resistivity material is disposed between the base region to which the gate electrode is connected and the otherwise immediately adjacent emitter region.

13 Claims, 5 Drawing Figures

GATE TURN OFF SEMICONDUCTOR RECTIFIERS

This is a continuation-in-part of Ser. No. 364,664 filed May 29, 1973, now abandoned.

This invention relates to semiconductor devices, and particularly to gate-controlled semiconductor rectifiers.

Known gate-controlled semiconductor rectifiers, also known as semiconductor controlled rectifiers (SCRs), are electrical switches which operate either in the off or non-conductive, voltage blocking state, or in the on, highly conductive state. To switch such devices from the off to the on state (with a voltage applied between the cathode and anode electrodes thereof), a triggering voltage is applied to a gate electrode of the device. After the device has been triggered into the on state, the triggering voltage can be removed and, with the gate open-circuited, the device remains in the on state as long as the current flowing between the anode and the cathode remains larger than a small value which is referred to as the "holding current." To switch the device from the on to the off state, i.e., to "interrupt" the device current, the generally necessary practice in commercially-available devices is to act directly on the external load circuit to reduce the anode to cathode current to a value below the holding current, e.g., open-circuit the external load circuit. That is, while it is possible to switch on such devices by application of a triggering voltage to the gate electrode, turn-off of the devices, for anode to cathode currents significantly larger than the holding current, by application of a turn-off voltage to the gate electrode is usually not possible.

While simple and inexpensive gate turn-off devices are not generally commercially available, the theory by which gate turn-off devices can be made is substantially complete, i.e., experimental gate turn-off devices made in accordance with the teachings of the prior art operate reasonably satisfactorily. A difficulty with such devices, however, which perhaps explains why these devices have not been more widely used is that they require relatively fine geometrics and somewhat expensive processing techniques, including relatively tight control over the doping levels in various ones of the different conductivity type regions of the devices. Other shortcomings of the prior art devices are discussed hereinafter. A need thus exists for improvement in such gate turn-off devices, whereby the devices can be made simply, inexpensively, and in accordance with existing SCR processing techniques. In the drawings:

Figure 1:
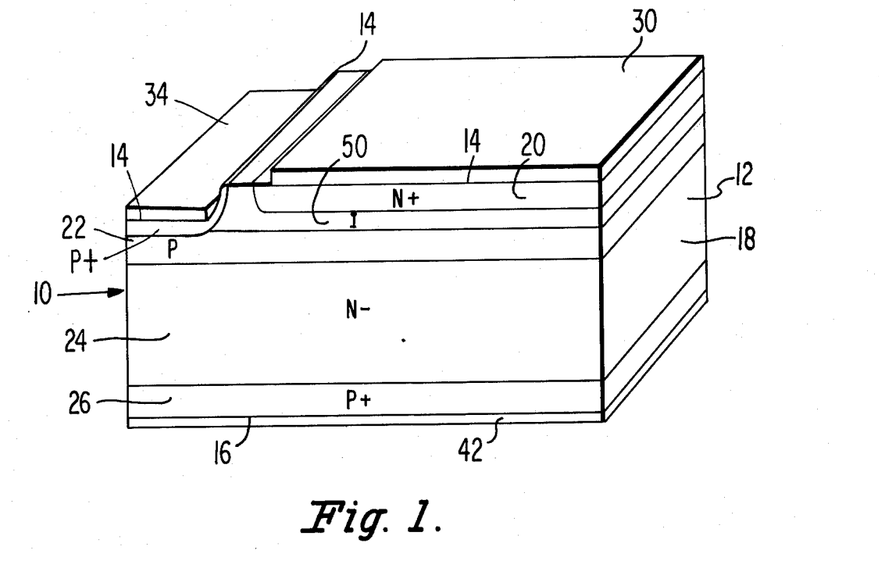
FIG. 1 is a view, in perspective, of a device made in accordance with this invention.

The device 10 shown in FIG. 1 comprises a rectangular pellet 12 of a semiconductor material, e.g., silicon, having a pair of opposed surfaces 14 and 16 and a side surface 18. Disposed within the pellet 12 are a number of regions of different type conductivity including an N emitter region 20, a P base region 22, an N base region 24, and a P emitter region 26. As shown, each base region is disposed between one of the emitter regions and the other one of the base regions.

Disposed on the upper surface 14 of the pellet 12 are a cathode electrode 30 in direct ohmic contact with the N emitter region 20 and a gate electrode 34 in direct ohmic contact with the P base region 22. The P base region 22 includes a highly doped (P+) portion disposed directly beneath and in contact with the gate electrode 34, the purpose of this portion being to improve the ohmic connection between the P base 22 and the electrode 34.

Disposed on the lower surface 16 of the pellet in direct ohmic contact with the P emitter region 26 is an anode electrode 42.

To the extent so far described, the device 10 is quite similar to known commercially available SCR devices, e.g., the RCA 106, of the type which cannot normally be turned off by means of a voltage applied to the device gate electrode.

The device 10 does differ from known commercially available devices, however, in that it includes a layer 50 of relatively low conductivity (as discussed below) disposed between the N emitter region 20 and the P base 22. The layer 50 is shown in FIG. 1 as being of intrinsic (I) material. In actuality, as is generally known, it is extremely difficult to provide a layer of intrinsic material within a pellet containing doped layers, and the layer 50 can be either N or P conductivity type, the particular conductivity type of the layer not being of particular significance.

Of significance, however, is that the average conductivity of the layer 50 is lower than that of either the N emitter region 20 or the P base 22, and is of such thickness that the avalanche breakdown voltage for voltages applied between the emitter region 20 and the base 22 is higher than it would otherwise be in the absence of the layer 50. More specifically, within the layer 50, the average concentration of dopant atoms of either conductivity type, including both the compensated and uncompensated atoms of that type, is less than the maximum concentration of the majority type dopant atoms within the gate connected base region. Also, because, in the usual case, the average concentration of dopant atoms in the emitter region is greater than in the adjacent gated base region, an even more specific definition is that, within the layer 50, the average concentration of dopant atoms of either conductivity type, including both the compensated and uncompensated atoms of that type, is less than the maximum concentration of the majority type dopant atoms within either the gate connected base region or its adjoining emitter region.

These definitions apply whether the layer 50 is of P or N type, or is intrinsic, and distinguish from prior art devices whether made by diffusion or epitaxial deposition techniques. Also, no reference to the thickness of the layer 50 is required in this definition since the mere presence of such layer, not present in the prior art devices, inherently increases the avalanche breakdown voltage between the adjoining emitter and gated base regions.

The device 10 can be turned off by a suitable voltage applied to the gate electrode 34. This is explained as follows.

In the device 10, as in SCR devices in general, in the conductive or on state of operation, with a voltage on the anode electrode 42 positive with respect to the cathode electrode 30, holes are injected into the N base region 24 from the P emitter 26 and cross the pellet 12 to the cathode electrode 30. Likewise, electrons are injected into the P base 22 from the N emitter 20 and cross the pellet 12 to the anode electrode 42. The injection process is continued and the device stays in its conductive state provided there are sufficient numbers of holes in the P base 22 to forward bias the PN junction (see below) between the P base 22 and the N emitter 20, and sufficient numbers of electrons in the N base region 24 to forward bias the PN junction between the N base 24 and the P emitter 26. (With a layer 50 of intrinsic material, the PN junction between the N emitter 20 and the P base 22 is the entire layer 50. With a layer 50 of either N or P conductivity type, a more conventional "line" PN junction is present, the layer 50 thus being part of either the P emitter 20 or the N base 24 depending upon its conductivity type).

One way to turn off such SCR devices is to apply a voltage of suitable polarity (negative with respect to the emitter region 20 for the device 10 shown in FIG. 1) to the gate electrode to drain the charge carriers out of the base region to which the gate electrode is ohmically connected (the "gate connected base region" hereinafter) and thus remove the forward biasing provided by the charge carriers.

A difficulty with this in conventional SCR devices, however, is that the resistance of the porion of the gate connected base region beneath the emitter is so great that only relatively small currents can be drained from the base region with the maximum voltage that can be applied to the gate electrode relative to the cathode electrode. That is, only comparatively small anode to cathode currents can be interrupted via the gate electrode. If it is attempted to drain off somewhat larger currents from the base region with this same maximum gate electrode voltage, to interrupt a higher anode to cathode current, the ohmic voltage drop through the base region is so high that the turn off voltage on the gate electrode does not "reach" across the entire extent of the emitter and does not completely cut off injection from the emitter.

Figure 2:
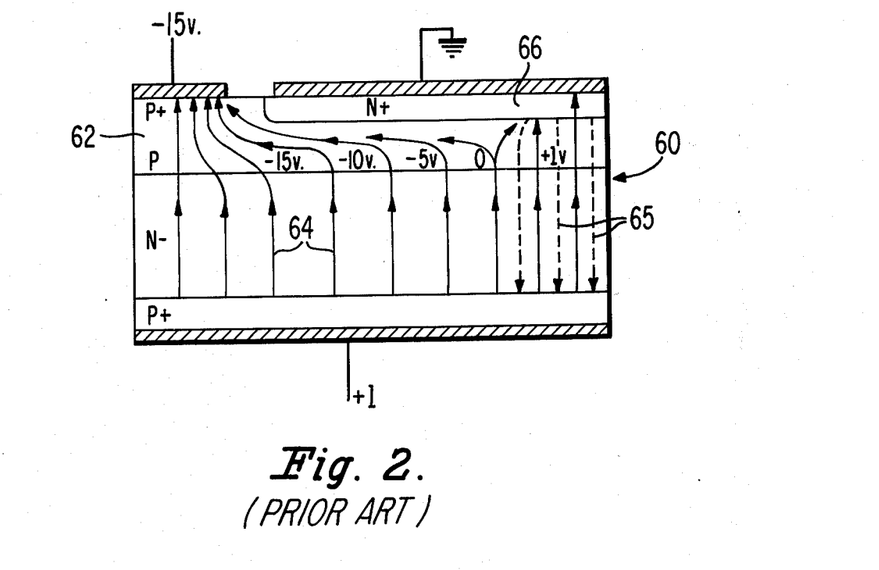
FIG. 2 is a view, in cross-section, of a prior art SCR showing the current flow and the potential distribution through a base region of the device upon the application of a turn-off voltage signal to the device gate electrode.

This problem is illustrated in FIG. 2, in which is shown a portion of a conventional SCR device 60, the various emitter and base regions of the device 60 being of the same conductivity type as those of the device 10 shown in FIG. 1. In FIG. 2, the current through the gate connected base region 62 is indicated by arrowed lines (solid lines 64 for holes and dashed lines 65 for electrons), and the potential distribution, in volts, along these current paths is indicated by numbers. In this example, the anode to cathode voltage is 1 volt (the forward direction voltage drop across the device), and the gate-to-cathode turn-off voltage is $-15$ volts.

As shown, owing to the large IR drop along the paths of current through the base region 62 portions beneath the emitter region 66, the entire negative turn-off voltage on the gate electrode is "dropped" or used-up short of portions of the emitter periphery most remote from the gate electrode. Thus, at these remote portions, the holes are not attracted to the gate electrode and remain to forward bias these portions of the emitter periphery. The device 60 thus stays on, i.e., electrons are injected into the base region 62 from the emitter region 66, and, if the current demand is too great for the emitter area available, the device burns out.

Means for improving this situation have been developed. Thus, for example, in U.S. Pat. No. 3,331,000 is described the use of a gate connected base region of high conductivity, the use of a segmented emitter, each emitter segment being surrounded by the base region of high conductivity, and the use of numerous gate electrodes connected to the base region. The IR voltage drip is thus reduced owing to the higher base material conductivity and the shorter current paths owing to the segmented construction.

The inclusion of the layer 50 of high resistivity material, in accordance with this invention, provides still another means for providing gate turn-off SCR devices; the improvements of the instant invention being useable either alone of in combination with at least some of the improvements described in the aforementioned U.S. Patent.

The purpose of the layer 50 of low conductivity between the N emitter 20 and the p base 22 is as follows. As above described, owing to the resistivity of the base region 22 and the IR drop along the current paths through the base region, the voltage at points along the junction between the N emitter 20 and the P base 22 most remote from the gate electrode 34 can be sufficiently positive to maintain these remote points positively biased and not cut off. This problem could be avoided, however, if it were possible to use a gate electrode turn-off voltage which is higher than the maximum voltage drop through the gate connected base region when the base region current is diverted from the emitter region to the gate electrode.

It so happens, however, that in commercially available SCR devices, and in devices improved in accordance with the aforementioned U.S. patent, there is a relatively low upper limit to the voltage that can be applied to the gate electrode without causing avalanche breakdown of the pellet material at the junction between the emitter and the adjoining gate connected base. Thus, the simple solution of using, in conventional SCR devices, an adequately high gate electrode turn-off voltage is not feasible since avalanche breakdown occurs at a voltage below that required to turn-off the device. Once such breakdown occurs, the device cannot be turned off via the device gate electrode. Moreover, by making the gate connected base region more conductive, in accordance with one prior art approach above described, the upper voltage which can be applied to the gate electrode without causing avalanche breakdown voltage is even further reduced.

By providing a layer of low conductivity between the gate connected base region and the adjoining emitter region, in accordance with the instant invention, the avalanche breakdown capability of the PN junction between these regions can be significantly increased, and much larger gate electrode turn-off voltages can be used.

The relationship between the conductivities and dimensions of the regions on either side of a PN junction and the voltage at which the PN junction will break down in the avalanche mode are known. In general, for a fixed conductivity on one side of the junction (e.g., the conductivity of the N emitter region 20 of the device 10), the avalanche voltage capability is determined by the thickness of the region on the other side of the junction in which is contained a particular number (on a unit area basis) of lattice bound charges, the particular number of charges being fixed for a given semiconductor material. That is, at a reversed biased PN junction, avalanche breakdown occurs when the depletion layer exposes a certain number of bound charges, each of the charges, no matter how far removed from the junction, contributing equally to the electrostatic field at the junction. However, while the electrostatic field at the junction is determined solely by the number of charges uncovered by the depletion layer, the voltage applied across the depletion layer is determined by the thickness thereof. Thus, the lower the conductivity of the region involved, the thicker is the depletion layer before the critical number of charges is uncovered, and the larger is the voltage which can be applied across the junction. Moreover, for a given voltage capability, the lower the conductivity of the region, the thinner need be the region to withstand the voltage.

The depletion layer, of course, extends in both directions away from the PN junction, and it is actually the total width of the layer, including the portions thereof on both sides of the junction, which determines the avalanche breakdown voltage capability of the junction.

Using a layer 50 of intrinsic material, as above described in connection with the embodiment of the invention shown in FIG. 1, the depletion layer extends, at comparatively small voltages, entirely across the layer 50 and into both the emitter region 20 and the base region 22, the degree of penetration of the depletion layer into these regions being a function of the conductivity characteristics of these regions immediately adjacent to the layer 50. However, even at comparatively low doping concentrations of the emitter and base regions, e.g., $10^{16}$ atoms/cm$^3$, the degree of penetration of the depletion layer into these regions before avalanche breakdown occurs is comparatively small, e.g., 1.5 micrometers, corresponding to an increase in breakdown voltage of about 15 volts, and the avalanche breakdown capability for voltages applied between the emitter region 20 and the base region 22 is determined primarily by the width of the layer 50. As explained hereinafter, base regions of comparatively high conductivity are generally preferred, in which case, owing to the lack of significant penetration of the depletion region into the base region, the particular conductivity of the base region actually used has little affect on the avalanche breakdown capability of the device.

With low emitter or base region conductivities, somewhat greater amounts of penetration of the depletion layer into these regions can occur prior to avalanche breakdown. For this reason, it is convenient to refer to a "depletable region" as that portion of the device, on opposite sides of the junction between the gated base region and its adjoining emitter region, into which the depletion layer extends when the junction is reverse biased to its critical field, i.e., to its avalanche breakdown voltage. The "depletable region" is therefore the maximum region which can be depleted of mobile charges by a reverse bias applied across the junction. Depending upon the doping concentrations involved, the depletable region has a definite, predictable width.

In accordance with the instant invention, the layer 50 is made of sufficiently low conductivity so that a thickness thereof (more generally, a depletable layer thickness) can be provided (i.e., a thickness containing fewer than the avalanching number of bound charges) which is capable of withstanding the gate-to-cathode voltage necessary to turn off the device. Moreover, since it is desirable that the layer 50 be as thin as possible, in order to reduce the device switching time and conductive state voltage drop, the layer 50 is preferably made as resistive as possible, consistent with other requirements of the device, to minimize the thickness thereof.

One advantage of the instant invention is that it provides an extra degree of flexibility in the design of gate turn-off devices, and, in general, makes it possible to make gate turn-off devices with somewhat less complexity. For example, in comparison with the devices shown in the aforementioned patent, the device 10 shown in FIG. 1 is somewhat less complex in that it has a single emitter region and a single gate connector rather than the multiple emitter and multiple gate electrode arrangement shown in the patent. Further, for devices of similar physical arrangement and complexity, devices made in accordance with the instant invention are capable of turning off higher currents owing to the higher turn-off voltage which can be applied thereto.

Another advantage of the instant invention is that the doping level of the gate connected base region is not as critical as it is in the prior art devices. That is, in prior art gate turn-off devices, the conductivity of the gate connected base region affects both the IR voltage drop therethrough plus the avalanche breakdown capability of the device - but to opposite effect. That is, the higher the base region conductivity the lower is the IR drop, which is desirable, but the lower is the avalanche breakdown capability which is not desirable. Thus, the conductivity of the base region must be carefully controlled to obtain the desired device characteristics. In devices according to the instant invention, however, the conductivity of the gate connected base region need not affect the avalanche breakdown capability of the device, and is thus not as critical as in the prior art devices.

Thus, by using a gated base region of higher conductivity than is possible or practical in the prior art, larger currents can be drained from the base region with the same amplitude gate electrode voltage owing to the smaller resistance to lateral current flow through the base region. Thus, larger anode to cathode electrode currents can be interrupted.

Similarly, because larger base region currents can be drained, either by virtue of the use of larger gate electrode turn-off voltages, or higher conductivity base regions, or a combination of both, the device turn-off time can be made shorter. This can be desirable, as generally known, for reducing the power dissipation during turn-off, for reducing the possibility of damage to the device during turn-off, and permitting the device to be used at a higher frequency of operation.

Since the amplitude of the gate electrode voltage necessary to turn off a device is determined in part by the conductivity of the gate connected base region and the path length of charge carriers from beneath the adjoining emitter to the gate electrode, the particular amount of improvement in avalanche breakdown capability required in any given device to withstand the gate electrode voltage is somewhat of a matter of choice, and thus not critical. Thus, the thickness and conductivity characteristics of the resistive layer 50 are likewise not critical.

Considering the design of devices in accordance with this invention, it is possible, without more, simply to increase the thickness of the gated base region of a known SCR device by adding thereto a low conductivity layer 50 such as that shown in FIG. 1. The resulting device would thus be capable of interrupting larger anode of cathode currents simply by virtue of the higher turn-off voltage which could be applied to the gate elecrtrode.

Such a device would not necessarily be of optimum design, however, since the increased base thickness tends towards increasing the voltage drop across the device when it is in its conducting mode of operation. This problem caused by increased base thickness can be corrected, however, by decreasing the thickness of the base region while increasing the conductivity thereof in order not to increase the resistance to gate current therethrough. As previously explained, increasing the base region conductivity, without adverse affect on the avalanche breakdown capability of the gated base junction, is made possible by the use of the low conductivity layer 50.

By further increasing the conductivity of the base region, thus further reducing the resistance thereof to gate current flow, either a larger anode to cathode current can be interrupted with the same turn-off voltage, or the same current can be interrupted with a lower turn-off voltage.

In one specific embodiment of this invention, in which a device with a P type gate is to be capable of operating at an average current density of the order of 200 amps per cm$^2$, with a main terminal blocking capability of 1200 volts, with a forward drop in the on state of less than 2.5 volts, with a lateral turn off distance (maximum distance between the gate electrode and the portion of the N emitter most remote from the gate electrode) of 0.05 cm, and turned off in less than one microsecond with an 80 volt gate signal, a suitable choice for the sheet resistivity (average bulk resistivity divided by thickness) of the gated base conductive layer is 100 ohms per square. A practical choice for resistivity and thickness of this layer can be an average resistivity of 0.2 ohm-cm and thickness of 0.002 cm, but it can also be 0.1 ohm-cm and 0.001 cm, or 0.5 ohm-cm and 0.005 cm. The exact choice of these parameters is based to some extent on the processes utilized to construct the device, and on the fact that most electrical characteristics (such as gate trigger current, turn on speed, forward drop, and turn off speed) are optimized by keeping the gated base layer as thin as possible. Since the device is to be operated with an 80 volt reverse gate drive, a practical avalanche breakdown voltage capability for the gated base-emitter junction is 100 volts. This can be achieved with a low conductivity layer 50 having a thickness of 8 micrometers and a dopant density of $3 \times 10^{15}$ atoms per cm$^3$, corresponding to a resistivity of 1.7 ohm cm N type of 4.8 ohm cm P type material. Alternatively, if a thinner layer 50 is required, such as for purposes of obtaining a faster turn on response, a layer 50 having a 100 volt avalanche capability can be provided with a thickness as low as 4 to 5 micrometers provided the doping density is reduced to the order of $10^{15}$ atoms per cm$^3$, corresponding to a resistivity of the order of 5 ohm-cm N type or 15 ohm-cm P type. Further increases in resistivity of the layer 50 can be used, if desired, but this would not result in any further significant reduction in allowable thickness of the layer 50 if the device is to have a 100 volt avalanche capability.

The 1200 volt main terminal blocking voltage requirement can be satisfied by constructing the N base with a resistivity in the order of 50 ohm-cm and a thickness of 0.018 cm. The N emitter and P emitter regions in this device can be similar to those in a conventional SCR, with surface concentrations of the order of $10^{19}$ to $10^{20}$ dopant atoms per cm$^3$, and thicknesses of the order of 0.002 cm. This device is capable of interrupting its rated steady state operating current, at an average current density of 200 amps per cm$^2$, in less than 1 microsecond with an 80 volt gate drive, and is capable of interrupting this current in less than 20 microseconds with a 25 volt drive. Peak reverse gate current when turning off with the 80 volt gate is of the order of one half the anode current, and with the 25 volt gate drive is in the order of one tenth of the anode current.

Figure 3:
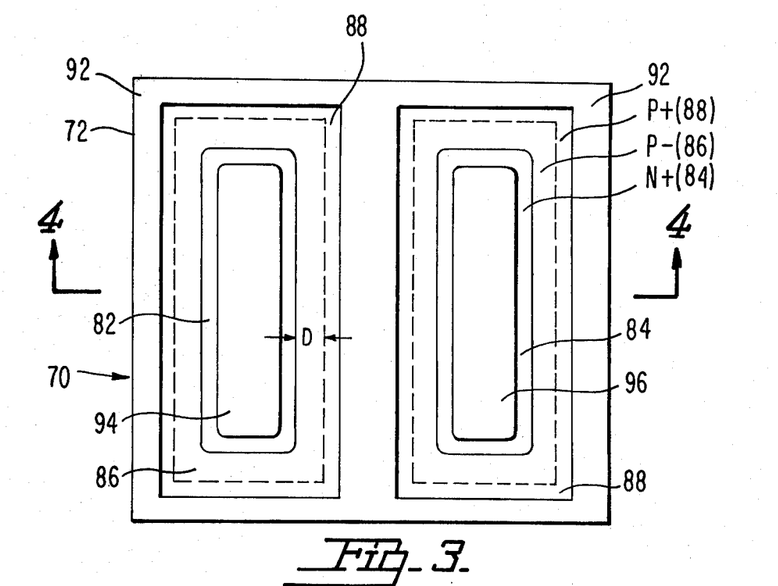
FIG. 3 is a plan view of a different embodiment of the invention.
Figure 4:
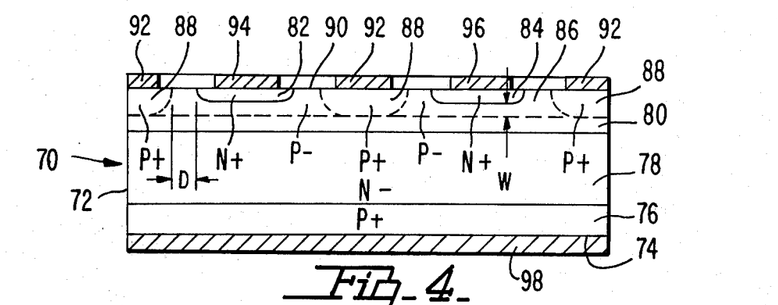
FIG. 4 is a cross-sectional view taken along line 4—4 of FIG. 3.

Another embodiment of the invention is shown at 70 in FIGS. 3 and 4. This device 70 is similar to the device 10 shown in FIG. 1 in that it comprises a rectangular pellet 72 of semiconductor material e.g., silicon, having, from the bottom surface 74 up, a P emitter region 76, an N base region 78, and a P base region 80. The device 70 also includes an N emitter which, in this embodiment, is segmented into two spaced apart regions 82 and 84. In other embodiments of the invention, not illustrated, the emitter region is segmented into many more tiny spaced apart regions.

Disposed between the P base region 80 and each emitter region 82 and 84 is a layer 86 of low conductivity P type material, e.g., of an average resistivity of 3 ohm-cm and a thickness of 8 micrometers, the purposes of which, as above described, is to increase the avalanche breakdown capability for voltages applied between the P base region 80 and the emitter regions 82 and 84. The layer 86 can also be of N type material or can be intrinsic.

As shown, the low conductivity layer 86 surrounds each region 82 and 84 of the N emitter at the surface 90 of the pellet 72, a portion 88 of high conductivity (P+) being disposed through the layer 86 between the pellet surface 90 and the P base region 80, the portion 88 also surrounding each emitter region 82 and 84 at the pellet surface. A gate electrode 92 is disposed on the pellet surface 90 in ohmic contact with the portion 88, the portion 88 thus providing a low resistance connection between the electrode 92 and the P base region 80. Of importance, as described hereinafter, is that the minimum distance between the emitter regions 82 and 84 and the high conductivity portion 88 at the surface 90 of the pellet 72 is greater than the width W of the low conductivity layer 86 beneath the emitter regions 82 and 84. That is, at the surface 90 of the pellet 72, the width of the low conductivity layer 86 between more heavily doped N and P regions is greater than in the bulk of the pellet 72.

Separate cathode electrodes 94 and 96 are disposed on the pellet surface 90 in ohmic contact with each emitter region 82 and 84, respectively. While not shown herein, the two cathode electrodes 94 and 96 are connected together by known means, e.g., a wire soldered to each electrode and bridging the space therebetween. An anode electrode 98 is disposed on the lower surface 74 of the pellet 72 in ohmic contact with the P emitter 76.

An advantage of the subdivided emitter arrangement of this device is that because each emitter region 82 and 84 is surrounded on all sides by a gate connected portion of the base region 80, the lateral turn off distance, or average path length for base region current beneath the N emitter regions 82 and 84 to the gate electrode 92, is shorter than in a device 10 (of comparable current ratings) of the type shown in FIG. 1 herein. Thus, the ohmic voltage drop through the base region 86 is less, and the gate electrode voltage required to turn-off the device 70 in a given period of time is less than that required to turn off a comparable device 10. Also, the power dissipation of the device 70 is lower during turn-off, and the device 70 can, therefore, be operated at a higher frequency than an otherwise comparable device 10.

A disadvantage of the device 70, as compared with a comparable device 10, is that the device 70 has a more complex geomerty and, because the gate electrode occupies a larger proportion of the pellet area, a larger pellet may be required for the device 70 than for a device 10 of comparable anode to cathode current ratings.

As generally known, the avalanche breakdown capability of a PN junction at the surface of a semiconductor body can be significantly less than within the bulk of the body. By making the width of the low conductivity layer 86 greater at the surface 90 than within the bulk of the pellet 72, as above described, the avalanche breakdown capability of the surface can be increased as desired (at the expense of greater pellet area) to at least equal that of the bulk breakdown capability. Thus, during device turn-off, the full rated gate electrode voltage can be applied to the device without danger of premature breakdown at the pellet surface. Such premature breakdown is a shortcoming of prior art devices such as those shown in the aforecited U.S. Pat. No. 3,331,000.

In the device 10 shown in FIG. 1, the use of a layer 50 which is wider at the pellet surface 14 than within the bulk of the pellet 12 is preferred for the same reason.

Figure 5:
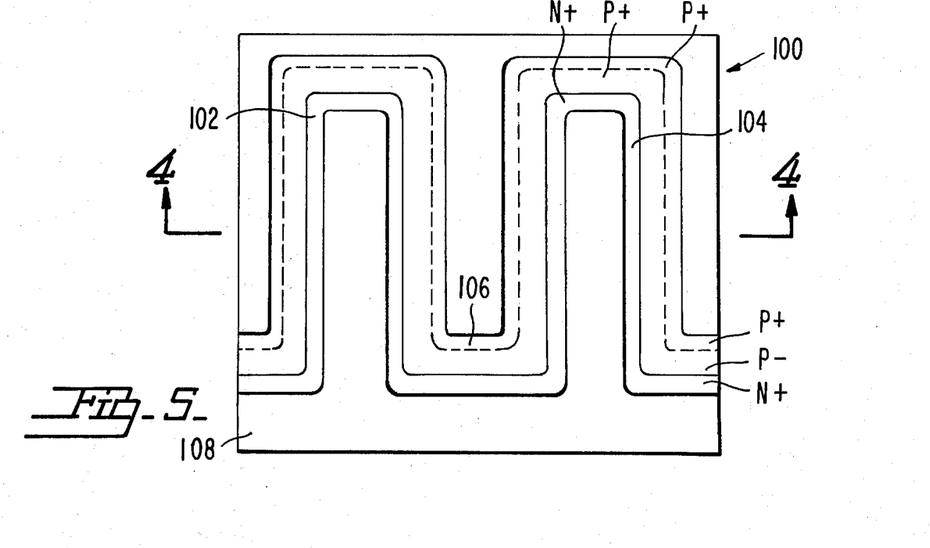
FIG. 5 is a plane view of still another embodiment of the invention.

In still another embodiment, shown in FIG. 5, a cross-sectional view along line 4—4 thereof being identical to the cross-sectional view of the device 70 shown in FIG. 4, the emitter region of the device 100 is not actually segmented, but includes two spaced-apart portions 102 and 104 which are connected together by a portion 106. A continuous cathode electrode 108 is used. The turn-off characteristics of the device 100 shown in FIG. 5 are substantially identical to those of the device 70 shown in FIGS. 3 and 4.

Fabrication of devices in accordance with the instant invention can employ well known procedures. For example, the device 10 shown in FIG. 1 herein can be fabricated as follows. Starting with a silicon semiconductor wafer having a thickness of about 8 mils (about 200 micrometers) and of a conductivity corresponding to that desired in the N base region 24, e.g., 30–40 ohm-cm, both the P emitter region 26 and the P base region 22 can be provided by known diffusion processes. For example, boron can be deposited on the major surfaces of the starting wafer at a concentration of $10^{18}$ atoms per $cm^2$, and the impurity atoms are driven into the wafer to a depth of about 1 mil (about 25.4 micrometers) on opposite sides thereof to form the two P regions. A 1 mil thick layer of high resistivity silicon, e.g., in the order of 50 ohm-cm or higher, is then epitaxially grown on one of the wafer surfaces, and using known masking procedures, a one-half mil (about 13 micrometers) layer of N material is diffused (using phosphorous at a surface concentration of 10˙atoms/$cm^2$) into a portion of the high resistivity material layer to form the N emitter 20. Then, using known masking procedures, another portion of the high resistivity material layer is etched away to a thickness of about 0.8 mil (about 20 micrometers), and boron is diffused into this etched away portion, as well as into the other major surface of the wafer to a depth of about 0.3 mil (about 7.5 micrometers), using a surface concentration of boron of about $10^{20}$ atoms/$cm^2$. The various electrodes, e.g., of nickel or aluminum, are then deposited and defined according to known procedures.

Fabrication of the devices shown in FIGS. 3 -5 can also employ known procedures. For example, starting with a silicon semiconductor wafer having a thickness of about 200 micrometers and of a conductivity corresponding to that desired in the N base region 78 (of the device 70), e.g., 30–40 ohm-cm, the P base region 80 can be provided by known processes of diffusion or epitaxial deposition. For example, boron can be deposited on one of the major surfaces of the starting wafer and the impurity atoms can be driven into the wafer to a depth of about 10 micrometers to form a P type layer having a sheet resistivity of about 100 ohms per square. Alternatively this layer could be formed by epitaxial deposition of a 10micrometer thick layer of 0.1 ohm cm P type material on the N type starting wafer. A 25 micrometer thick layer of higher resistivity P type silicon, of the order of 3 ohm cm, is then epitaxially grown over the 100 ohm per square P layer. Then, using known masking procedures, a higher conductivity layer of P material (using boron at a surface concentration of $10^{19}$ to $10^{20}$ atoms per $cm^3$) is diffused into a selected portion of the epitaxial layer to form the gate contacts 88, and into the opposite wafer face to form the P emitter region 76. Then, using known masking procedures, a layer of N material (using phosphorus at a surface concentration of $10^{19}$ to $10^{20}$ atoms/$cm^3$) is diffused into other portions of the epitaxial layer to a depth of about 12 micrometers to form the N emitter regions 82 and 84. The various electrodes, e.g., of nickel or aluminum, are then deposited and defined according to known procedures.

It is noted that in U.S. Pat. No. 3,538,401, issued to Chang K. Chu on Nov. 3, 1970, there is described an SCR device which, for reasons discussed therein not relating to the provision of a gate turn-off device, includes a relatively highly resistive layer between the gate connected base region and the adjacent emitter region. While not known for certain, it is believed that this device, either by itself, or if used in combination with the structural arrangements shown in the aforementioned U.S. Pat. 3,331,000 (such combination not being suggested in either of the patents), would operate successfully as a gate turn off device. However, the Chu patent does not specifically teach or discuss the gate turn-off capability of the devices disclosed therein, thus neither shows nor suggests modifications thereof for the purpose of providing different types of gate turn-off devices. For example, there is nothing in the Chu patent showing or suggesting the use of segmented or spaced apart emitter region portions as shown in FIGS. 3, 4 and 5 herein. As discussed above, such construction provides improved results with respect to turn-off time, operating frequency, and turn-off power dissipation.

Similarly, since the Chu device does not depend for its operation of a reverse bias applied to the gate junction, there is nothing in the Chu patent showing or suggesting the use of a low conductivity layer between the gated base and the emitter which is wider at the surface of the semiconductor pellet than within the bulk thereof.

To achieve the drift field characteristics desired in the Chu devices, it is apparently essential that the conductivity of the base-emitter intermediate layer (e.g., layer 20 shown in FIG. 5 of Chu) be graded with decreasing conductivity in the direction away from the emitter region. While of no great significance with respect to the emitterbase avalanche capability, the optimum grading for gate turn-off purposes would be a grading in the opposite direction, such a grading providing a higher avalanche voltage while also providing higher conductivity for reducing base current voltage drop. Next best, and actually preferred because of the greater ease of fabrication, is an intermediate layer of uniform conductivity.

In each of the devices of the Chu patent, the intermediate layer of low conductivity is of the same conductivity type as that of the contiguous base region. As above-described, however, the intermediate region of low conductivity can be of a conductivity type opposite to that of the contiguous base region.

Finally, the Chu patent teaches that the material of the layer of lower conductivity has a resistivity of less than 12 ohm-cm and preferably never exceeds 10 ohm-cm. In accordance with this invention, and depending upon the particular device being made, the layer of low conductivity can have a average resistivity in excess of 12 ohm-cm.

What is claimed is:

1. A gate controlled rectifier comprising:
a body of semiconductor material including two emitter regions and two base regions, each base region being disposed between an emitter region and the other of said base regions, adjacent regions being of opposite type conductivity and having a PN junction therebetween
a gate electrode connected to one of said base regions, and
means for increasing the avalanche breakdown capability of said rectifier for voltages applied between said one base region and the emitter region adjacent thereto, said means comprising:
  a. a layer of semiconductor material of the same conductivity type as that of said adjacent emitter region between said one base region and said adjacent emitter region, in which the average concentration of dopant atoms of each conductivity type, including both the compensated and uncompensated atoms thereof, is less than the maximum concentration of the majority type dopant atoms in said one base region, and
  b. said layer having a thickness adequate to increase said avalanche breakdown capability to a voltage greater than the voltage drop through said one base region caused by the diversion of current within said one base region from said adjacent emitter region to said gate electrode said current being generated by a turn-off voltage applied to said gate electrode.

2. A gate controlled rectifier comprising:
a body of semiconductor material including two emitter regions and two base regions, each base region being disposed between an emitter region and the other of said base regions, adjacent regions being of opposite type conductivity and having a PN junction therebetween,
a gate electrode connected to one of said base regions, and
means for increasing the avalanche breakdown capability of said rectifier for voltages applied between said one base region and the emitter region adjacent thereto, said means comprising:
  a. a layer of semiconductor material between said one base region and said adjacent emitter region in which the average concentration of dopant atoms of each conductivity type, including both the compensated and uncompensated atoms thereof, is less than the maximum concentration of the majority type dopant atoms in said one base region,
  b. said layer having a thickness adequate to increase said avalanche breakdown capability to a voltage greater than the voltage drop through said one base region caused by the diversion of current within said one base region from said adjacent emitter region to said gate electrode said current being generated by a turn-off voltage applied to said gate electrode, and
  c. the conductivity within said layer increasing in the direction away from said one base region.

3. A gate controlled rectifier comprising:
a body of semiconductor material including two emitter regions and two base regions, one of said emitter regions having two spread-apart portions, each base region being disposed between a respective emitter region and the other of said base regions, adjacent regions being of opposite type conductivity and having a PN junction therebetween,
a gate electrode connected to one of said base regions on opposite sides of said spaced-apart portions of said one emitter region to provide separate paths for current through said one base region from each of said opposite sides, and
means for increasing the avalanche breakdown capability of said rectifier for voltages applied between said one base region and said one emitter region, said means comprising:
  a. a layer of semiconductor material between said one base region and said one emitter region in which the average concentration of dopant atoms of each conductivity type, including both the compensated and uncompensated atoms thereof, is less than the maximum concentration of the majority type dopant atoms in said one base regions, and
  b. said layer having a thickness adequate to increase said avalanche breakdown capability to a voltage greater than the voltage drop through said one base region caused by the diversion of current within said one base region from said adjacent emitter region to said gate electrode said current being generated by a turn off voltage applied to said gate electrode.

4. The rectifier of claim 3, in which the conductivity within said layer increases in the direction away from said one base region.

5. A gate controlled rectifier comprising:
a body of semiconductor material including two emitter regions and two base regions, each base region being disposed between a respective emitter region and the other of said base regions, adjacent regions being of opposite type conductivity and having a PN junction therebetween,
one junction between one of said emitters and the one base region thereto being disposed within the bulk of said body and extending to a surface thereof,
a gate electrode connected to one said base region, and
means for increasing the avalanche breakdown capability of said rectifier for voltages applied between said one base region and said emitter region comprising:
  a. a layer of semiconductor material between said one base region and said one emitter region, said layer having a portion within the bulk and a portion extending to said surface of said body, the average concentration of dopant atoms within said layer of each conductivity type, including both the compensated and uncompensated atoms thereof, being less than the maximum concentration of the majority type dopant atoms in said one base region, b. said layer having a thickness adequate to increase said avalanche breakdown capability to a voltage greater than the voltage drop through said one base region caused by the diversion of current from said adjacent emitter region to said gate electrode said current being generated by a turn off voltage applied to said gate electrode and c. the thickness of said layer being greater at said surface than within the bulk of said body.

6. A rectifier as in claim 5, in which said one emitter region has two spaced-apart portions and in which said gate electrode is connected to said one base region on opposite sides of each of said spaced-apart portions of said one emitter region to provide separate paths for current through said one base region from each of said opposite sides.

7. A rectifier as in claim 6, in which the conductivity within said layer increases in the direction away from said one base region.

8. A rectifier as in claim 7 in which said layer is of the same conductivity type as that of said one base region.

9. A rectifier as in claim 8, in which the conductivity within said layer increases in the direction away from said one base region.

10. A gate controlled rectifier comprising: a body of semiconductor material including two emitter regions and two base regions, each base region being disposed between an emitter region and the other of said base regions, adjacent regions being of opposite type conductivity and having a PN junction therebetween, a gate electrode connected to one of said base regions, and means for increasing the avalanche breakdown capability of said rectifier for voltages applied between said one base region and the emitter region adjacent thereto, said means comprising:

a. a layer of semiconductor material of the same conductivity type as that of said adjacent emitter region in which the average concentration of dopant atoms of each conductivity type, including both the compensated and uncompensated atoms thereof, is less than the maximum concentration of the majority type dopant atoms in said one base region, b. said layer having a thickness adequate to increase said avalanche breakdown capability to a voltage greater than the voltage drop through said one base region caused by the diversion of current within said one base region from said adjacent emitter region to said gate electrode said current being generated by a turn off voltage applied to said gate electrode, and c. the conductivity within said layer being uniform throughout said layer.

11. The rectifier of claim 3, in which the conductivity throughout said layer is uniform.

12. The rectifier of claim 6, in which the conductivity throughout said layer is uniform.

13. The rectifier of claim 8, in which the conductivity throughout said layer is uniform.

* * * * *

UNITED STATES PATENT OFFICE
CERTIFICATE OF CORRECTION

Patent No. 4,062,032   Dated December 6, 1977

Inventor(s) John Manning Savidge Neilson

It is certified that error appears in the above-identified patent and that said Letters Patent are hereby corrected as shown below:

| | |
|---|---|
| Col. 1, line 43: | "geometrics" should be --geometries-- |
| Col. 3, line 28: | "porion" should be --portion-- |
| Col. 4, line 6: | "drip" should be --drop-- |
| Col. 4, line 13: | "of" (1st occurrence) should be --or-- |
| Col. 4, line 17: | "p" should be --P-- |
| Col. 5, line 45: | "low" should be --lower-- |
| Col. 6, line 68: | "of" should be --to-- |
| Col. 7, line 50: | "of" should be --or-- |
| Col. 8, line 7: | after "gate" insert --drive-- |
| Col. 9, line 8: | "geomerty" should be --geometry-- |

UNITED STATES PATENT OFFICE
CERTIFICATE OF CORRECTION

Patent No. 4,062,032     Dated December 6, 1977

Inventor(s) John Manning Savidge Neilson

It is certified that error appears in the above-identified patent and that said Letters Patent are hereby corrected as shown below:

Col. 9, line 59:   number "10" should be--$10^{20}$--

Col. 10, line 56:  "of" should be--on--

Col. 12, line 57:  after "region" insert--adjacent--

Signed and Sealed this

Twenty-eighth Day of March 1978

[SEAL]

Attest:

RUTH C. MASON
Attesting Officer

LUTRELLE F. PARKER
Acting Commissioner of Patents and Trademarks